United States Patent [19]
Johnson et al.

[11] Patent Number: 5,994,936
[45] Date of Patent: Nov. 30, 1999

[54] RS FLIP-FLOP WITH ENABLE INPUTS

[75] Inventors: Bret Johnson; Ralf Schneider, both of München, Germany

[73] Assignee: Siemens Aktiengesellschaft, Munich, Germany

[21] Appl. No.: 09/160,880

[22] Filed: Sep. 25, 1998

[30] Foreign Application Priority Data

Sep. 30, 1997 [DE] Germany ............... 197 43 347

[51] Int. Cl.⁶ ............................................. H03K 3/356
[52] U.S. Cl. .................................. 327/217; 327/225
[58] Field of Search ........................... 327/199, 208, 327/209, 210, 214, 217, 219, 225

[56] References Cited

U.S. PATENT DOCUMENTS

| | | | |
|---|---|---|---|
| 3,982,985 | 7/1975 | Kawagoe | 327/210 |
| 4,342,927 | 8/1982 | Hull | 327/225 |
| 5,191,245 | 3/1993 | Kang | 327/262 |

FOREIGN PATENT DOCUMENTS

| | | | |
|---|---|---|---|
| 3-49410 | 3/1991 | Japan | 327/217 |

OTHER PUBLICATIONS

Patent Abstracts of Japan No. 56–73921 A (Aoki), dated Jun. 19, 1981.

Patent Abstracts of Japan No. 60–70817 A (Uchida), dated Apr. 22, 1985.

*Primary Examiner*—Tuan T. Lam
*Attorney, Agent, or Firm*—Herbert L. Lerner; Laurence A. Greenberg

[57] ABSTRACT

An RS flip-flop has an inverter, connected to an input terminal of the RS flip-flop, a NOR gate having an Enable-Set input, a NAND gate having an Enable-Reset input, and a first and a second transistor connected to the inverter. The outputs of the NOR and NAND gates are connected, via the gate paths of the first and second transistors, to the gate electrode of a third and a fourth transistor, respectively. The third and the fourth transistor are connected in series and form a holding element, whose common connection point is connected to the output of the inverter and to the output terminal of the flip-flop.

9 Claims, 2 Drawing Sheets

RS FLIP-FLOP WITH ENABLE INPUTS

BACKGROUND OF THE INVENTION

FIELD OF THE INVENTION

The present invention relates to an RS flip-flop having an inverter connected to an input of the RS flip-flop, a NOR gate with an Enable-Set input, a NAND gate with an Enable-Reset input, and a first and a second transistor connected to the inverter.

FIG. 2 illustrates an exemplary embodiment of an RS flip-flop with Enable inputs. An input connection IN of the RS flip-flop is connected to an input of an inverter 1 whose output is connected to one input of an AND gate 2. The other input of the AND gate 2 is connected to an input which is an Enable-Set connection ENS. The output of the AND gate 2 is connected to the Set connection of a flip-flop 3. In addition, the input connection IN is connected to one input of a second AND gate 4 whose other input is connected to an input connection ENR for an Enable-Reset signal. The output of the second AND gate 4 is connected to the Reset input of the flip-flop 3.

In the circuit described above and also in the circuit described below, a signal at the connection ENS may be the inverse signal of a signal at the connection ENR (ENS= $\overline{\text{ENR}}$).

FIG. 3 shows a specific circuit design with the flip-flop 3. NAND gates 5, 6 are used in place of the AND gates 2,4. The actual flip-flop 3 comprises two further NAND gates 7, 8. An output connection of each NAND gate 7, 8 is fed back to an input connection of the respective other NAND gate.

Irrespective of the specific design, the RS flip-flops shown in FIGS. 2 and 3 require a signal to pass through a total of three gates from the input connection IN to an output connection Q of the flip-flop 3. In the exemplary embodiment of FIG. 3, a signal has to pass through gates 1, 5, and 7. This results in a relatively long delay time (transit time), so that existing RS flip-flops are fairly slow and cannot provide or develop a pulse quickly.

SUMMARY OF THE INVENTION

It is accordingly an object of the invention to provide an RS flip-flop which overcomes the above-mentioned disadvantages of the heretofore-known RS flip-flops of this general type and which has a particularly short delay time and is able to develop a pulse very quickly.

With the foregoing and other objects in view there is provided, in accordance with the invention, an RS flip-flop comprising an input terminal; an output terminal; an inverter connected to the input terminal and having an output; a first transistor connected to the inverter and having a gate path; a second transistor connected to the inverter and having a gate path; a holding element having a third transistor with a gate electrode and a fourth transistor with a gate electrode, the third and the fourth transistor being connected in series and forming a node therebetween, the node being connected to the output terminal and to the output of the inverter; a NOR gate having an Enable-Set terminal and an output connected to the gate electrode of the third transistor via the gate path of the first transistor; and a NAND gate having an Enable-Reset terminal and an output connected to the gate electrode of the fourth transistor via the gate path of the second transistor.

An RS flip-flop in accordance with the invention has an inverter connected to an input connection of the RS flip-flop, a NOR gate which has an Enable-Set connection, and a NAND gate which has an Enable-Reset connection. The RS flip-flop has a first and a second transistor connected to the inverter. The outputs of the NOR and NAND gates are connected, via the gate paths of the first and the second transistor, respectively, to the gate electrodes of a third and a fourth transistor, respectively. The third and the fourth transistor are connected in series to form a holding (latching) element. Their common connection point is connected to the output of the inverter and to the output connection of the flip-flop.

A first significant advantage of the RS flip-flop according to the invention is that it requires four transistors less than conventional flip-flops. In addition, the circuit design specified above requires a signal to pass through only one gate between the input connection of the RS flip-flop and its output connection. This is achieved by connecting the output of the inverter directly to the output connection of the RS flip-flop via the common connection point of the holding element. This results in an extremely short delay time (transit time) so that the RS flip-flop is very fast. Driving the third and the fourth transistor of the holding element via the NOR gate and the NAND gate, respectively, precludes any "prohibited state" of the series-connected third and fourth transistors in which these transistors would short-circuit the operating voltage VDD to the reference voltage VSS. The inverter usually comprises a p-channel MOS transistor connected in series with an n-channel MOS transistor. The first transistor, which is driven via the NOR gate, is then likewise a p-channel MOS transistor connected between the operating voltage and the drain or the source of the p-channel MOS transistor in the inverter. Similarly, the second transistor, which is driven via the NAND gate, is an n-channel MOS transistor connected in series between the reference voltage VSS and the drain or source of the n-channel MOS transistor in the inverter. The gate of the first transistor is connected to the gate of the third transistor, which is an n-channel MOS transistor. Likewise, the gate of the second transistor is connected to the gate of the fourth transistor, which in this case is a p-channel MOS transistor. The third and fourth transistors are arranged in series between the reference voltage and the operating voltage.

In accordance with a further feature of the invention, the inverter includes a p-channel MOS transistor, and the first transistor is a p-channel MOS transistor connected in series with the p-channel MOS transistor of the inverter.

In accordance with another feature of the invention, the inverter includes an n-channel MOS-transistor, and the second transistor is an n-channel MOS transistor connected in series with the n-channel MOS transistor of the inverter.

In accordance with yet another feature of the invention, the first transistor, the inverter, and the second transistor are connected in series between an operating voltage and a reference voltage.

In accordance with a further feature of the invention, the third transistor is an n-channel MOS transistor.

In accordance with another feature of the invention, the fourth transistor is a p-channel MOS transistor.

In accordance with yet another feature of the invention, the third transistor and the fourth transistor are connected in series between a reference voltage and an operating voltage.

In accordance with a further feature of the invention, the Enable-Set terminal of the NOR gate is a first input of the NOR gate and the NOR gate has a second input connected to the output terminal.

In accordance with yet another feature of the invention, the Enable-Reset connection of the NAND gate is a first input of the NAND gate and the NAND gate has a second input connected to the output terminal.

Other features which are considered as characteristic for the invention are set forth in the appended claims.

Although the invention is illustrated and described herein as embodied in an RS flip-flop with Enable inputs, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 and 3 have already been described in detail in the background of the invention. Corresponding parts are identified by the same reference symbols in the figures.

DESCRIPTION OF THE PREFERRED EMBODIMENTS

Figure 1:
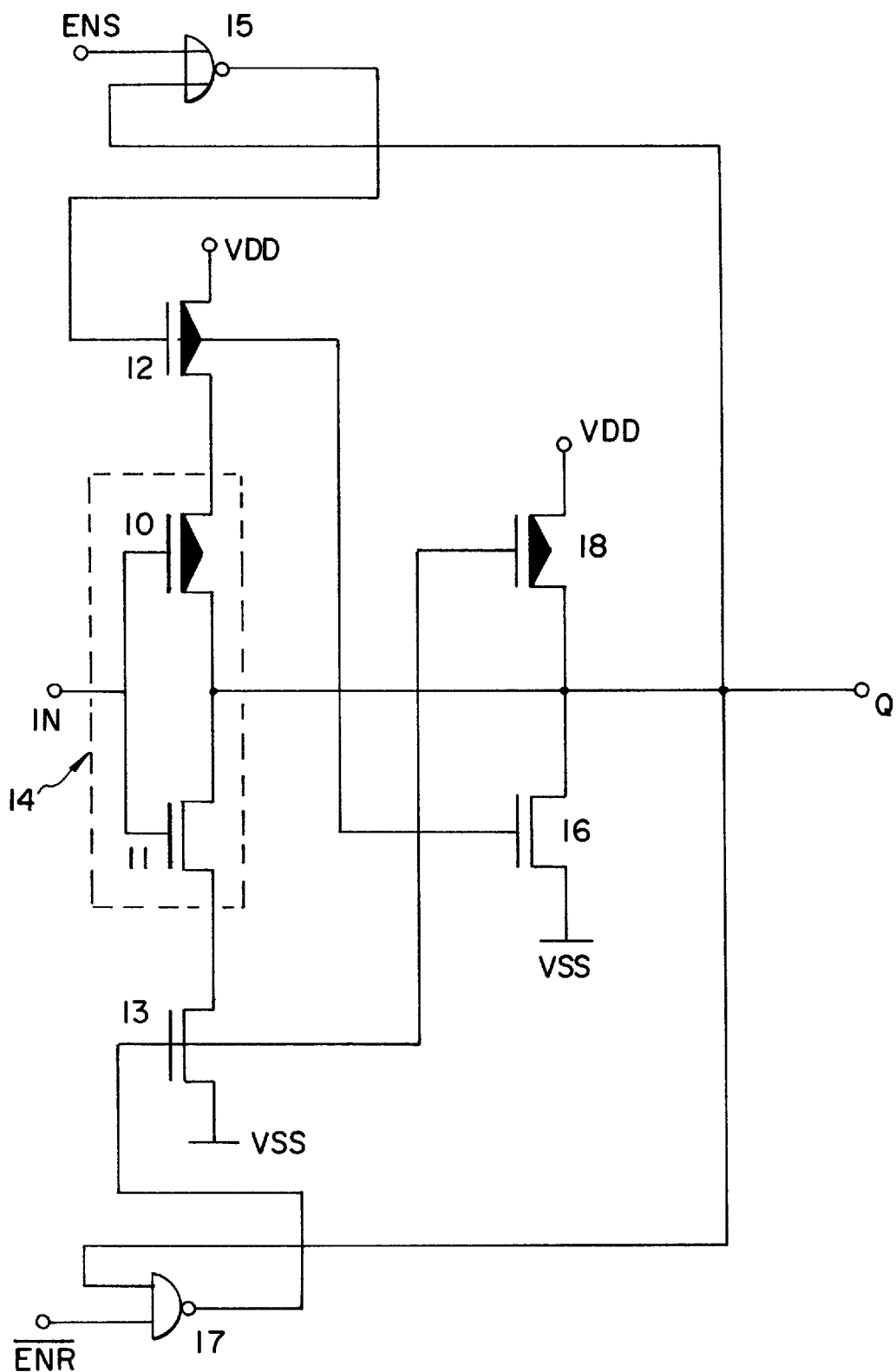
FIG. 1 is a circuit diagram of an exemplary embodiment of the RS flip-flop according to the invention.
Figure 2:
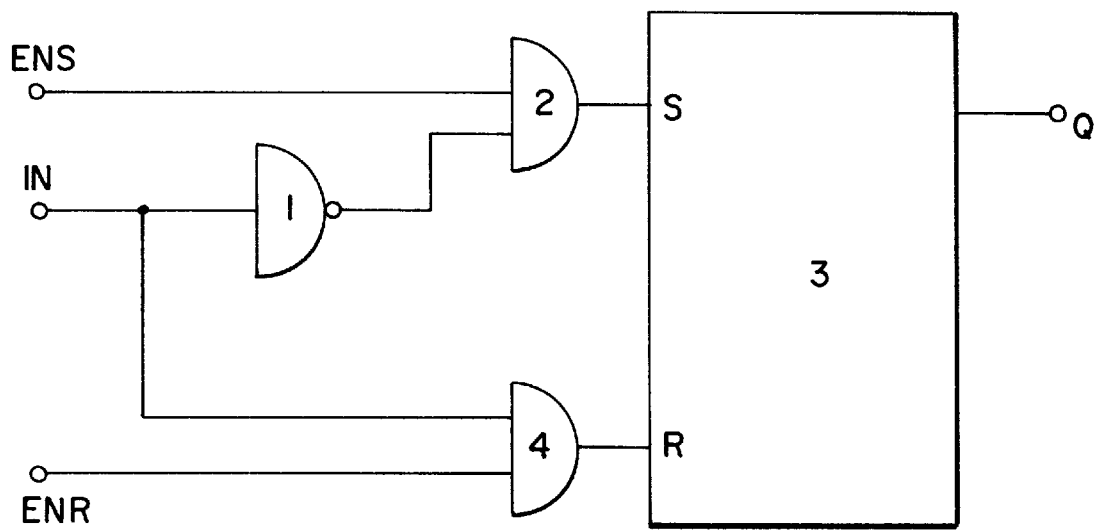
FIG. 2 is a block diagram of an existing RS flip-flop.
Figure 3:
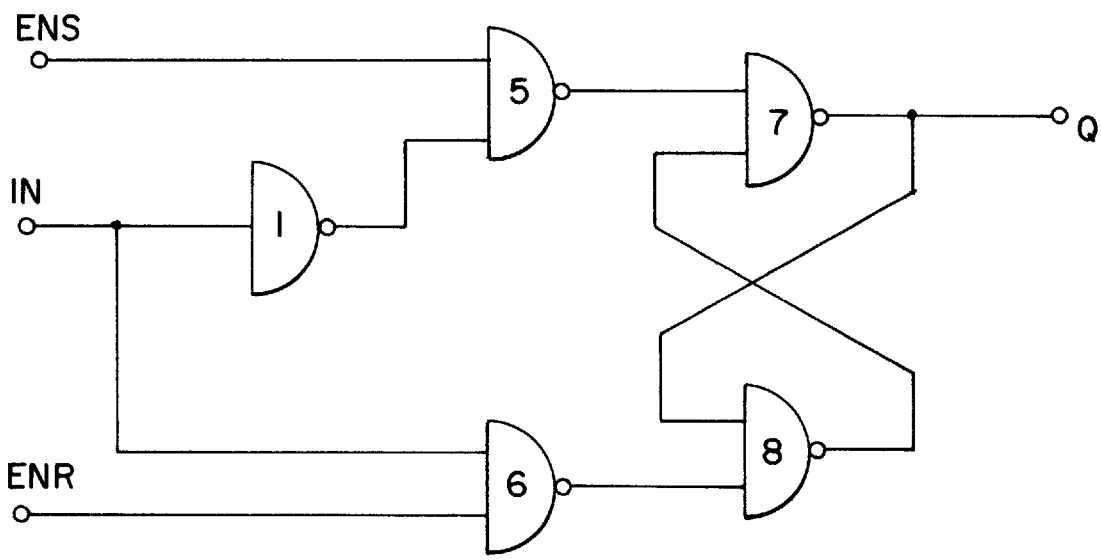
FIG. 3 is a circuit diagram of a flip-flop of the type shown in FIG. 2.

Referring now to the figures of the drawings in detail and first, particularly, to FIG. 1 thereof, there is shown an input connection IN of an RS flip-flop connected to gate electrodes of two MOS transistors 10, 11. The MOS transistors 10, 11 are connected in series and form an inverter, whose transistor 10 is a p-channel MOS transistor and whose transistor 11 is an n-channel MOS transistor. A further p-channel MOS transistor 12 is connected in series with the p-channel MOS transistor 10. An n-channel MOS transistor 13 is connected in series with the n-channel MOS transistor 11. The transistors 10, 11 form an inverter 14. The output of the inverter 14 is directly connected to the output connection Q of the RS flip-flop at the connection point of the transistors 10, 11.

The transistors 10, 11, 12 and 13 are connected in series between the operating voltage VDD and the reference voltage VSS.

An Enable-Set signal is supplied to one input connection ENS of a NOR gate 15. The other input of this NOR gate 15 is connected to the output connection Q. The output connection of the NOR gate 15 is connected to the gate electrode of an n-channel MOS transistor 16 via the gate electrode of the transistor 12.

An Enable-Reset signal is supplied to one input connection $\overline{ENR}$ ($\overline{ENR}$ is inverted with respect to ENR) of a NAND gate 17. The other input connection of this NAND gate 17 is to the output connection Q of the RS flip-flop. The output connection of the NAND gate 17 is connected to the gate electrode of a p-channel MOS transistor 18 via the gate electrode of the n-channel MOS transistor 13.

The transistors 18 and 16 are connected in series between the operating voltage VDD and the reference voltage VSS, and their common connection point is connected to the output connection Q and to the connection point of the transistors 10, 11.

The table below indicates the different states of the flip-flop for a Set signal ens at the connection ENS, a Reset signal enr at the connection ENR, a signal $q^{-1}$ at the output connection Q for the state prior to switching, a signal "in" at the input connection IN and a signal q at the output connection Q after the switching, "x" denoting an arbitrary signal, "D" denoting data and, in the customary fashion, "1" representing "Enable" and "0" representing "Disable".

In the first state, the flip-flop is ready to be reset (cf. left-hand half of the corresponding column), wherein the reset flip-flop then stores the value "0" (cf. right-hand half of the column). In the second state, if the signal "0" is supplied to the connection ENS, and the output connection Q is also at the value "0", then "0" is stored, irrespective of what signals "x" are supplied to the connections ENR and IN. In the third state, the flip-flop is ready to be set (cf. left-hand half of the corresponding column), and the set flip-flop there stores the value "1" (cf. right-hand half of the column). In the fourth state, if the signal "1" (or "0" at $\overline{ENR}$) is then supplied to the connection ENR, and the output connection Q is likewise at the value "1", then "1" is stored, irrespective of what signals "x" are supplied to the connections ENS and IN. In the fifth state, the flip-flop stores the data "D". In the sixth state, the flip-flop is "transparent" and performs the function of an inverter.

TABLE

| | First State | Second State | Third State | Fourth State | Fifth State | Sixth State |
|---|---|---|---|---|---|---|
| ens | 0 | 0 | 1 | x | 0 | 1 |
| enr | 1 | x | 0 | 0 | 0 | 1 |
| $q^{-1}$ | 1 | 0 | 0 | 1 | D | |
| in | | x | | x | | $\overline{D}$ |
| q | 1 0 | 0 | 0 1 | 1 | D | $\overline{D}$ |

As can be seen in FIG. 1, a signal applied to the input connection IN is fed from the transistors 10, 11 to the output connection Q through only one gate, so that the delay time of a signal is extremely short. The RS flip-flop according to the invention can therefore develop a pulse very quickly.

We claim:

1. An RS flip-flop, comprising:
   an input terminal;
   an output terminal;
   an inverter connected to said input terminal and having an output;
   a first transistor connected to said inverter and having a gate electrode;
   a second transistor connected to said inverter and having a gate electrode;
   a holding element having a third transistor with a gate electrode and a fourth transistor with a gate electrode, said third and said fourth transistors being connected in series and forming a node therebetween, said node being connected to said output terminal and to said output of said inverter;
   a NOR gate having an Enable-Set terminal and an output connected to said gate electrodes of said third transistor said and said first transistor; and
   a NAND gate having an Enable-Reset terminal and an output connected to said gate electrodes of said fourth transistor said second transistor.

2. The RS flip-flop according to claim 1, wherein said inverter includes a p-channel MOS transistor, and said first transistor is a p-channel MOS transistor connected in series with said p-channel MOS transistor of said inverter.

3. The RS flip-flop according to claim 1, wherein said inverter includes an n-channel MOS-transistor, and said second transistor is an n-channel MOS transistor connected in series with said n-channel MOS transistor of said inverter.

4. The RS flip-flop according to claim 1, wherein said first transistor, said inverter, and said second transistor are connected in series between an operating voltage and a reference voltage.

5. The RS flip-flop according to claim 1, wherein said third transistor is an n-channel MOS transistor.

6. The RS flip-flop according to claim 1, wherein said fourth transistor is a p-channel MOS transistor.

7. The RS flip-flop according to claim 1, wherein said third transistor and said fourth transistor are connected in series between a reference voltage and an operating voltage.

8. The RS flip-flop according to claim 1, wherein said Enable-Set terminal of said NOR gate is a first input of said NOR gate and said NOR gate has a second input connected to said output terminal.

9. The RS flip-flop according to claim 1, wherein said Enable-Reset terminal of said NAND gate is a first input of said NAND gate and said NAND gate has a second input connected to said output terminal.

* * * * *